United States Patent [19]
Yoshino et al.

[11] Patent Number: 6,057,634
[45] Date of Patent: May 2, 2000

[54] PIEZOELECTRIC COMPONENT

[75] Inventors: Hirohide Yoshino, Toyama-ken; Yuji Fujita, Toyama, both of Japan

[73] Assignee: Murata Manufacturing Co., Ltd., Japan

[21] Appl. No.: 09/138,970

[22] Filed: Aug. 24, 1998

[30] Foreign Application Priority Data

Oct. 3, 1997 [JP] Japan ................................. 9-287672

[51] Int. Cl.[7] .................................................. H01L 41/08
[52] U.S. Cl. ........................... 310/348; 310/345; 310/351
[58] Field of Search .................................... 310/344, 345, 310/348, 351, 352, 353

[56] References Cited

U.S. PATENT DOCUMENTS

| | | | |
|---|---|---|---|
| 5,750,926 | 5/1998 | Schulman et al. | 174/52.3 |
| 5,900,790 | 5/1999 | Unami et al. | 310/366 |
| 5,925,974 | 7/1999 | Yamamoto et al. | 310/348 |

FOREIGN PATENT DOCUMENTS

11-004137  1/1999  Japan .

Primary Examiner—Nestor Ramirez
Assistant Examiner—Peter Medley
Attorney, Agent, or Firm—Graham & James LLP

[57] ABSTRACT

A piezoelectric component includes a substrate on which pattern electrodes are disposed. A piezoelectric resonator is placed on the substrate. The piezoelectric resonator generates a longitudinal vibration and includes a base member. External electrodes are disposed at both sides of a groove formed on one side surface of the base member. At the center of the base member in the longitudinal direction, support members made from an electrically conductive material are provided on the external electrodes. The support members are bonded to the pattern electrodes of the substrate via electrically conductive adhesive. An insulating adhesive is disposed between the support members. As a result of this structure, the piezoelectric component has a sufficient bonding strength between the base member and the piezoelectric resonator and prevents a short circuit from occurring between the support members formed in the piezoelectric resonator.

20 Claims, 11 Drawing Sheets

PIEZOELECTRIC COMPONENT

BACKGROUND OF THE INVENTION

1. Technical Field of the Invention

The present invention relates to piezoelectric components, and more particularly, to piezoelectric components including a piezoelectric resonator vibrating in a longitudinal vibration mode, such as an oscillator, a discriminator, and a filter.

2. Description of the Related Art

Figure 16:
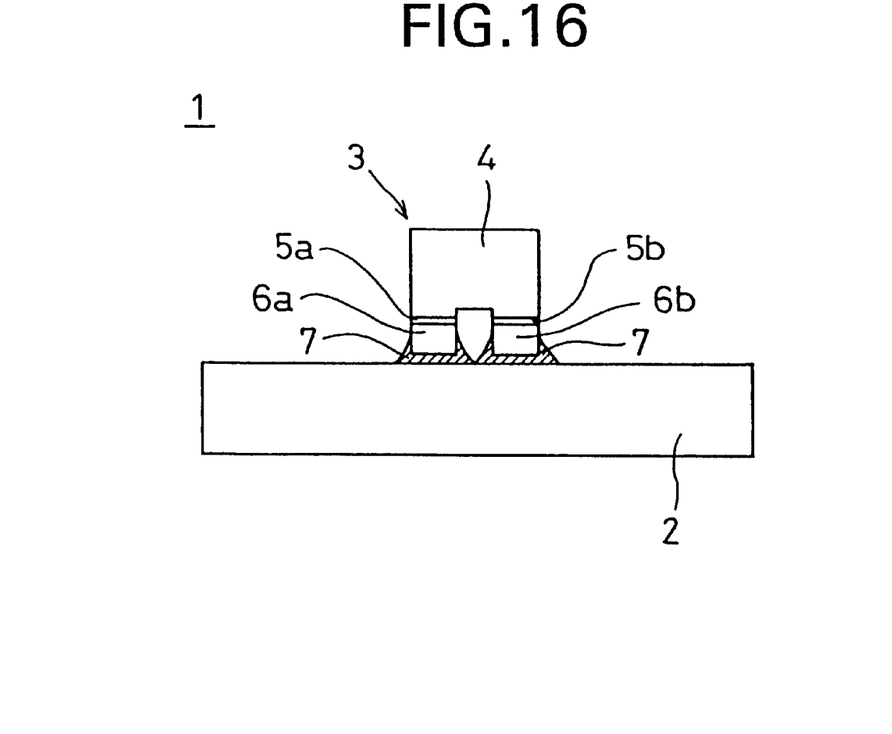
FIG. 16 is a side view of a piezoelectric component serving as a background of the present invention.
Figure 17:
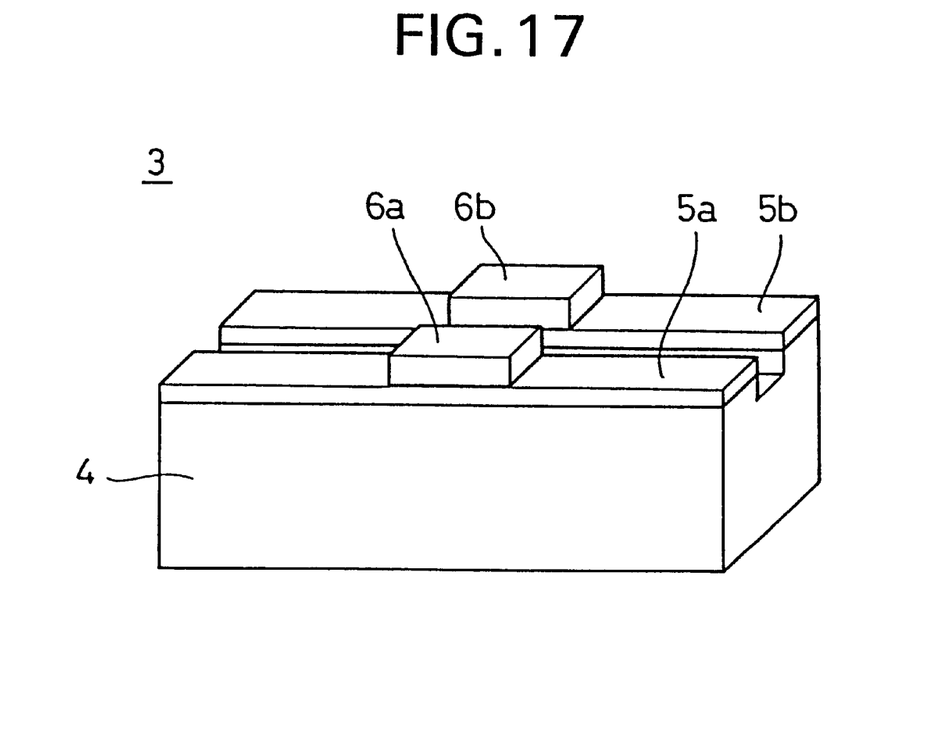
FIG. 17 is a perspective view of a piezoelectric resonator used for the piezoelectric component shown in FIG. 16.

FIG. 16 is a side view of a piezoelectric component relating to preferred embodiments of the present invention. A piezoelectric component 1 includes a substrate 2. On one surface of the substrate 2, pattern electrodes (not shown) are disposed. A piezoelectric resonator 3 is mounted on the substrate 2. The piezoelectric resonator 3 includes a base member 4 as shown in FIG. 17. Two external electrodes 5a and 5b are provided on one side surface of the base member 4. The base member 4 has, for example, a structure in which piezoelectric layers and electrodes are laminated along the longitudinal direction of the base member 4. The piezoelectric layers are polarized in the longitudinal direction of the base member 4. The laminated electrodes are connected to the external electrodes 5a and 5b. When a signal is applied between the external electrodes 5a, 5b, an electric field is applied in the longitudinal direction of the base member 4. When the electric field is applied, the piezoelectric layers expand and contract to generate a longitudinal vibration in a basic mode in the base member 4.

At the center of the base member 4 along the longitudinal direction thereof, support members 6a and 6b made from an electrically conductive material are mounted on the two external electrodes 5a and 5b. To mount the piezoelectric resonator 3, the support members 6a and 6b mounted on the external electrodes 5a and 5b, are bonded via electrically conductive adhesive 7 to pattern electrodes disposed on the substrate 2. Therefore, when a signal is input to the pattern electrodes, a longitudinal vibration is excited in the base member 4. Since the support members 6a and 6b are mounted at the center of the base member 4, which serves as a node during generation of the longitudinal vibration, the vibration of the base member 4 is prevented from being suppressed or hindered.

Because the piezoelectric component 1 must be compact, it is necessary that the piezoelectric resonator 3 is compact. Therefore, in order for the piezoelectric resonator 3 having the above structure to be compact, the support members 6a and 6b must be small. When the support members 6a and 6b are small, areas where the adhesive 7 is applied to bond the support members 6a, 6b to the pattern electrodes on the substrate 2 become small and a sufficient bonding strength is not obtained. When the amount of the adhesive 7 is increased to obtain a high bonding strength, the adhesive 7 flows out from the bottom surfaces of the support members 6a, 6b as shown in FIG. 16, and the adhesive 7 may contact between the two support members 6a and 6b to cause a short circuit between the support members 6a, 6b.

SUMMARY OF THE INVENTION

To overcome the problems described above, the preferred embodiments of the present invention provide a piezoelectric component which has a sufficient bonding strength between a base member and a piezoelectric resonator and in which a short circuit is prevented from occurring between the support members provided in the piezoelectric resonator.

A preferred embodiment of the present invention provides an electronic component including a substrate on which pattern electrodes are disposed, a piezoelectric resonator vibrating in a longitudinal vibration mode disposed on the substrate and including a base member and two external electrodes provided on one side surface of the base member, and two electrically conductive bonding members between the pattern electrodes and the two external electrodes and supporting the piezoelectric resonator on the substrate, wherein an insulating bonding member is disposed between the two electrically conductive bonding members.

In the above described electronic component, the insulating bonding member may be an insulating protrusion which is disposed on the substrate between the two electrically conductive bonding members.

The above described electronic component may further include electrically conductive support members disposed on the two external electrodes of the piezoelectric resonator, wherein the pattern electrodes of the substrate are connected to the two external electrodes through the support members with the electrically conductive bonding members.

The preferred embodiments of the present invention also provide an electronic component including a substrate on which pattern electrodes are disposed and a piezoelectric resonator vibrating in a longitudinal vibration mode disposed on the substrate, and including a base member and two external electrodes provided on one side surface of the base member, wherein two electrically conductive support members are disposed on the two external electrodes so as to connect the pattern electrodes and the two external electrodes and support the piezoelectric resonator on the substrate, the support members and the pattern electrodes are connected by the electrically conductive bonding members, and each of the support members are shaped such that the area of a surface at the pattern electrode side is smaller than that of a surface at the external-electrode side, and the distance between the two support members is larger at the pattern electrode side than at the external-electrode side.

Each of the above piezoelectric components may be configured such that the base member has a lamination structure in which piezoelectric layers and inner electrodes connected to the external electrodes are laminated in the longitudinal direction. The piezoelectric layers are preferably polarized in the longitudinal direction of the base member and the piezoelectric resonator is vibrated in a longitudinal vibration in a basic mode when an electric field is applied.

Since the insulating bonding member is disposed between the two electrically conductive bonding members, the electrically conductive bonding members can not touch each other between the support members, thereby preventing the support members from being short-circuited.

Since the areas of the bottom surfaces of the support members disposed on the two external electrodes in the piezoelectric resonators are made smaller and the distance between the support members is made larger at the pattern electrode side, the electrically conductive bonding material flowing toward the inside moves along the inner surfaces of the opposing support members, preventing the material from flowing between the support members.

Since the insulating protrusion is provided on the substrate between the support members, the electrically conductive bonding members do not touch each other, thereby preventing the support members from being short-circuited to each other.

Therefore, the piezoelectric resonator has a significantly reduced size and is exceedingly compact. As a result, a piezoelectric component using the piezoelectric resonator can be made very compact. In addition, since the bonding strength between the piezoelectric resonator and the substrate is greatly increased to a very large amount, it is extremely difficult to separate the piezoelectric resonator from the substrate, allowing a highly reliable piezoelectric component to be provided.

With the use of a piezoelectric resonator having a lamination-structure base member, the direction of polarization, the direction of the applied electric field, and the vibration direction are preferably all the same so as to comprise a stiffened type resonator. As compared with an unstiffened piezoelectric resonator, in which the vibration direction differs from the direction of polarization and the direction of the applied electric field, the stiffened piezoelectric resonator has a larger electromechanical coupling coefficient.

Other features and advantages of the present invention will become apparent from the following description of preferred embodiments of the invention which refers to the accompanying drawings.

DETAILED DESCRIPTION OF PREFERRED EMBODIMENTS

Figure 1:
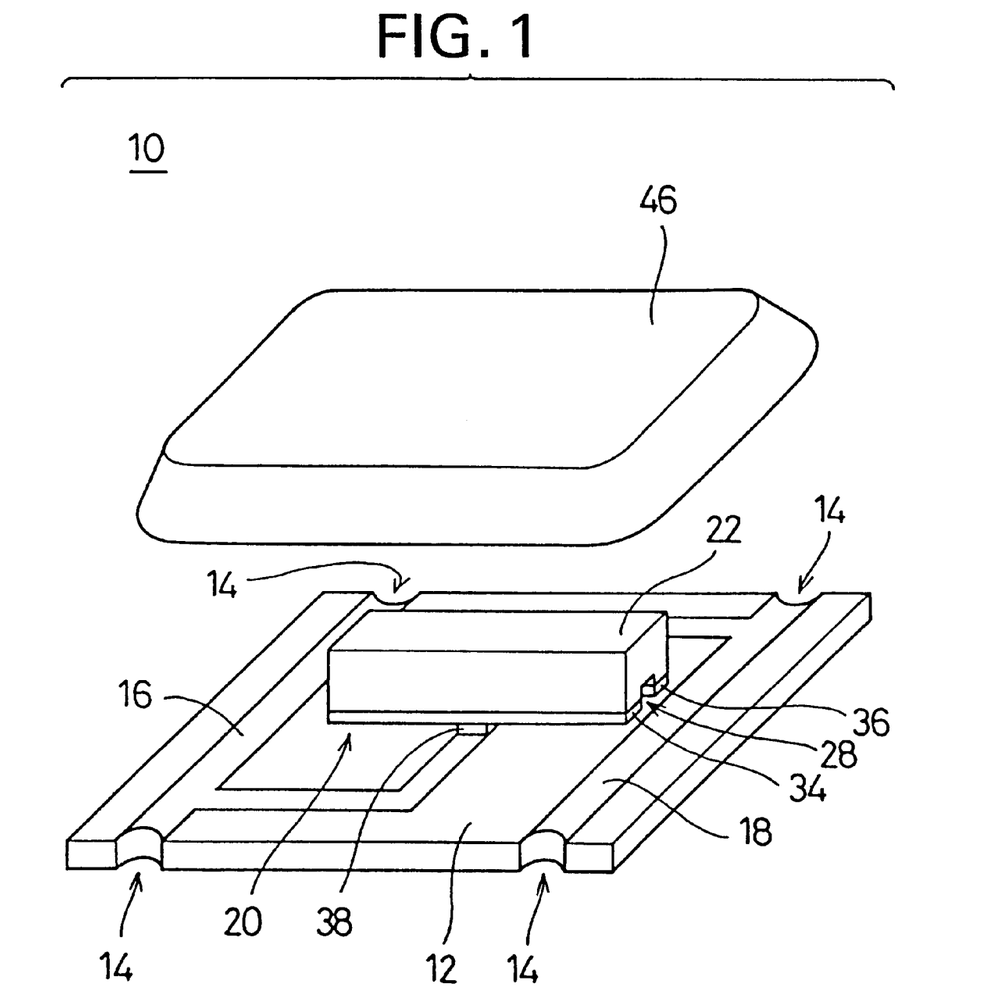
FIG. 1 is an exploded perspective view of a piezoelectric component according to a preferred embodiment of the present invention.

FIG. 1 is a perspective view of a piezoelectric component according to a preferred embodiment of the present invention. The piezoelectric component 10 includes a substrate 12. At opposing end portions of the substrate 12, two indentations 14 are preferably formed, respectively. On one surface of the substrate 12, two pattern electrodes 16 and 18 are disposed. One pattern electrode 16 is disposed between opposing indentations 14 and extends in a substantially L-shaped arrangement from a point near one end toward an approximate center of the substrate 12. The other pattern electrode 18 is disposed between the other opposing indentations 14 and extends in a substantially L-shaped arrangement from a point near the other end toward the approximate center of the substrate 12. The pattern electrodes 16 and 18 are arranged such that the electrodes 16, 18 are opposed each other and separated by a gap at the approximate center of the substrate 12. As the substrate 12, a known substrate, such as a resin substrate, including a glass-epoxy substrate, a ceramic substrate, including an alumina substrate, and a multilayer substrate having a pattern circuit disposed therein can be used.

Figure 2:
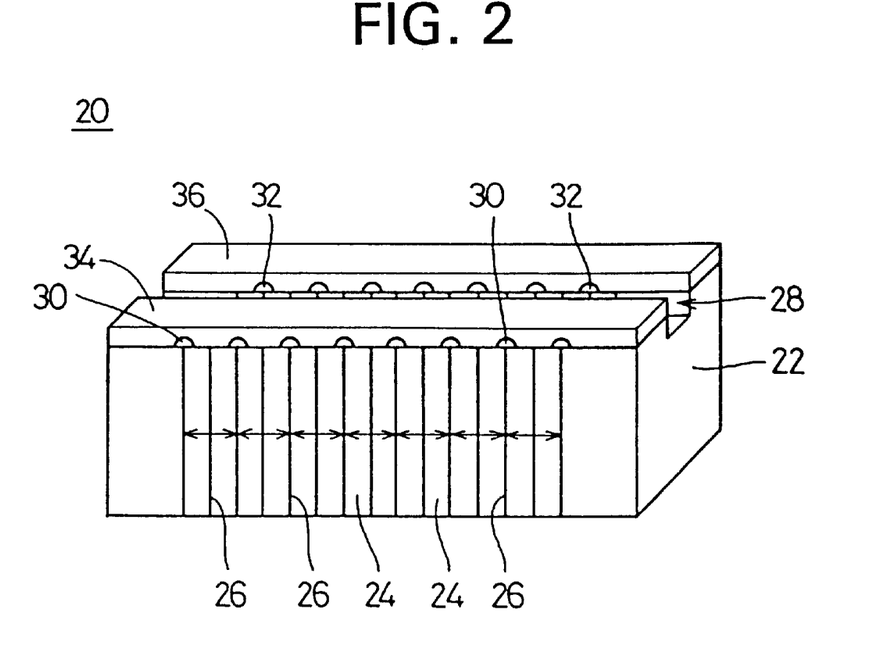
FIG. 2 is a view of a piezoelectric resonator used for the piezoelectric component shown in FIG. 1.

A piezoelectric resonator 20 is mounted on the substrate 12. As shown in FIG. 2, the piezoelectric resonator 20 includes a base member 22. The base member 22 has a structure in which a plurality of piezoelectric layers 24 and electrodes 26 are laminated. The piezoelectric layers 24 and the inner electrodes 26 are arranged such that their main surfaces are substantially perpendicular relative to the longitudinal direction of the base member 22. The piezoelectric layers 24 are polarized in opposite directions at both sides of an inner electrode 26 in the longitudinal direction of the base member 22 as shown in FIG. 2. Both ends of the base member 22 are preferably not polarized.

Figure 3:
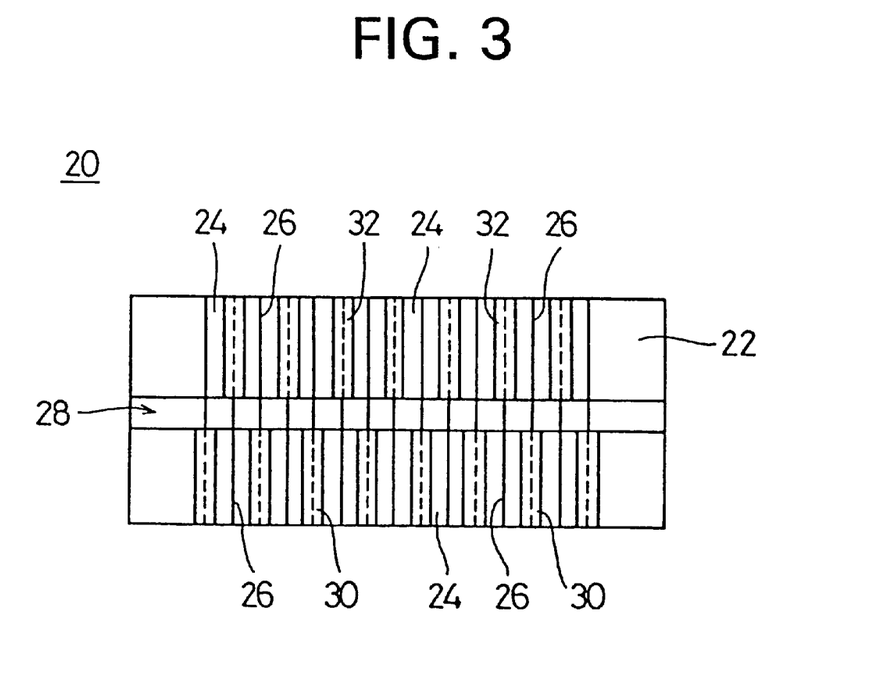
FIG. 3 is a plan of insulating films provided in the piezoelectric resonator shown in FIG. 2.

On one side surface of the base member 22, a groove 28 extending in the longitudinal direction of the base member 22 is provided. The groove 28 is preferably provided at the approximate center in the width direction of the base member 22 and divides the side surface into two parts. As shown in FIG. 3, on the side surface divided by the groove 28, first insulating films 30 and second insulating films 32 are provided. At one side of the side surface of the base member 22 divided by the groove 28, the first insulating films 30 cover the exposed portions of alternate electrodes 26. At the other side of the side surface of the base member 22 divided by the groove 28, the second insulating films 32 cover the exposed portions of the other alternate electrodes 26, which are not covered by the first insulating films 30 at the one side of the groove 28.

In the portions where the first and second insulating films 30 and 32 are provided on the base member 22, namely, on both sides of the groove 28, external electrodes 34 and 36 are provided. Therefore, the external electrode 34 is connected to the inner electrodes 26 which are not covered by the first insulating films 30, and the external electrode 36 is connected to the inner electrodes 26 which are not covered by the second insulating films 32. In other words, adjacent inner electrodes 26 are connected to the external electrodes 34 and 36, respectively.

The groove 28 is not necessarily required. The piezoelectric resonator may be formed such that the external electrodes 34 and 36 are formed separately on one side surface of the base member 22 without the groove 28 being provided therebetween.

Figure 4:
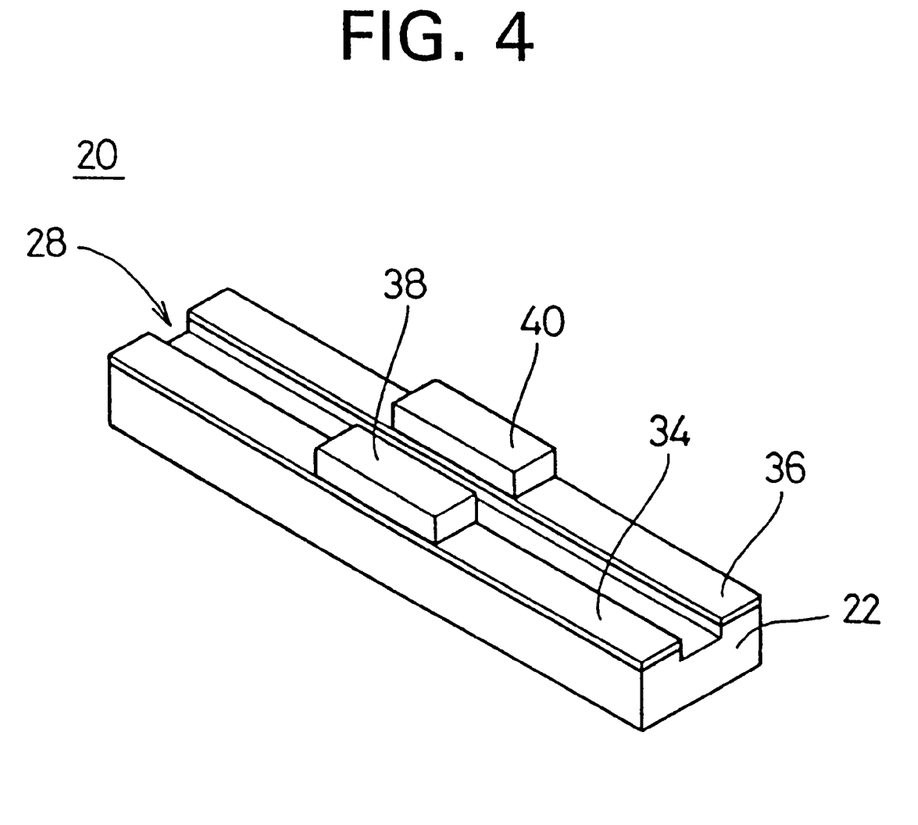
FIG. 4 is a perspective view showing a condition in which support members are provided on the piezoelectric resonator shown in FIG. 2.

At the approximate center of the base member 22 in the longitudinal direction, as shown in FIG. 4, support members 38 and 40 are provided on the external electrodes 34 and 36. The support members 38 and 40 are preferably made from an electrically conductive material such as electrically conductive paste and preferably have a substantially rectangular shape with substantially the same width as the widths of the external electrodes 34 and 36. Therefore, the distance between the support members 38 and 40 is substantially the same as the distance between the external electrodes 34 and 36.

Figure 5:
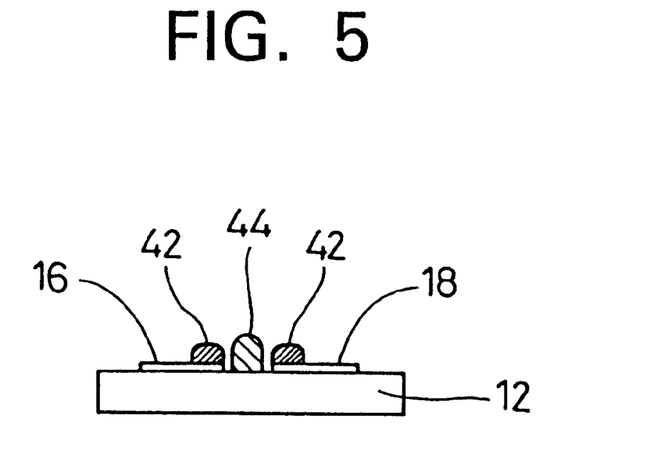
FIG. 5 is a side view of a substrate to which the piezoelectric resonator shown in FIG. 4 is mounted.
Figure 6:
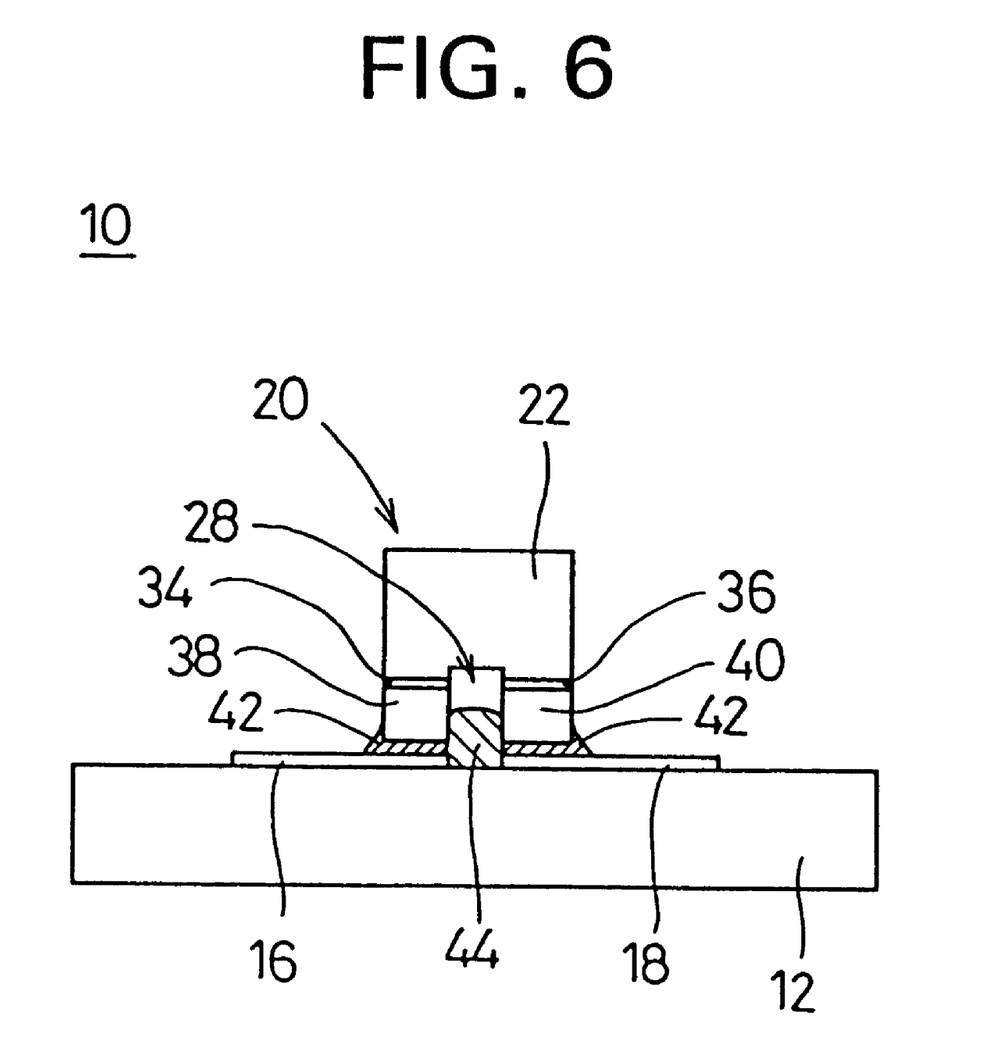
FIG. 6 is a side view of a condition in which the piezoelectric resonator shown in FIG. 4 is mounted on the substrate shown in FIG. 5.

To place the piezoelectric resonator 20 on the substrate 12, as shown in FIG. 5, electrically conductive adhesive 42 serving as an electrically conductive bonding member is applied to the portions where the pattern electrodes 16 and 18 are provided on the base member 12. Then, insulating adhesive 44 serving as an insulating bonding member is applied between the electrically conductive adhesive 42. The support members 38 and 40 are bonded to the pattern electrodes 16 and 18 with the electrically conductive adhesive 42 as shown in FIG. 6. The insulating adhesive 44 is disposed between the support members 38 and 40. A cap 46 is mounted so as to cover the piezoelectric resonator 20. This piezoelectric component 10 is used as an oscillator or a discriminator.

In this piezoelectric component 10, a signal is input between the pattern electrodes 16 and 18. When a signal is input, an electric field is applied in opposite directions to the piezoelectric layers 24 which are polarized in opposite directions in the base member 22. Therefore, the piezoelectric layers 24 expand and contract as a single integral unit in a single direction. Therefore, the entire piezoelectric resonator 20 vibrates in the longitudinal direction in a basic mode with the approximate center of the base member 22 in the longitudinal direction serving as a node.

In the piezoelectric resonator 20 used for the piezoelectric component 10, the polarization direction, the electric field direction, and the direction of vibration are preferably all the same. In other words, the piezoelectric resonator 20 is a stiffened type resonator. Therefore, the piezoelectric resonator 20 has a larger electromagnetic coupling coefficient and a larger difference $\Delta F$ between the resonant frequency and the antiresonant frequency than an unstiffened piezoelectric resonator, in which the direction of vibration differs from the direction of polarization and that of the electric field. Consequently, when the piezoelectric resonator 20 is used for a filter or an oscillator, the frequency bandwidth can be increased.

Since the support members 38 and 40 are provided at the approximate center of the base member 22 in the longitudinal direction in the piezoelectric component 10, the node of the piezoelectric resonator 20 is supported. Therefore, the vibration of the piezoelectric resonator 20 is not hindered or prevented.

A piezoelectric resonator used in the present invention is not limited to a lamination-structure piezoelectric resonator. An unstiffened piezoelectric resonator which has electrodes on the front and rear surfaces of the piezoelectric substrate and which is polarized in the thickness direction may be used. Instead of the support members 38 and 40, the electrically conductive adhesive 42 and the insulating adhesive 44 may be used to directly connect and support the piezoelectric resonator 20 on the substrate 12.

In the piezoelectric component 10, the support members 38 and 40 are bonded to the pattern electrodes 16 and 18 via the electrically conductive adhesive 42. The electrically conductive adhesive 42 applied to the surfaces corresponding to the support members 38 and 40 may flow out to both sides of the support members 38 and 40. Since the insulating adhesive 44 is disposed between the two support members 38 and 40, however, the electrically conductive adhesive 42 flowing out between the support members 38 and 40 is blocked by the insulating adhesive 44. Therefore, a short circuit between the two support members 38 and 40 is prevented by the electrically conductive adhesive 42. Because the support members 38 and 40 are prevented from being short-circuited by this novel arrangement and structure, the amount of the electrically conductive adhesive 42 used can be increased to enhance the bonding strength between the external electrodes 34, 36 and the pattern electrodes 16, 18.

In this piezoelectric component 10, since the insulating adhesive 44 bonds the support members 38 and 40 to the substrate 12, a high bonding strength is achieved. Especially when soft insulating adhesive 44, such as a silicone resin or a urethane resin, is used, even if the base member 22 touches the insulating adhesive 44, vibration is unlikely to be hindered or prevented and a high bonding strength is achieved. When an insulating adhesive 44 made from a hard material such as an epoxy resin is used, if the insulating adhesive 44 contacts the base member 22, vibration may be prevented. To avoid this, when an insulating adhesive 44 made from such a hard material is used, it is preferred that the insulating adhesive 44 does not contact the base member 22. For the same reason, it is preferred that the support members 38 and 40 be made from a soft material, such as a silicone resin or a urethane resin, mixed with a silver powder.

Figure 7:
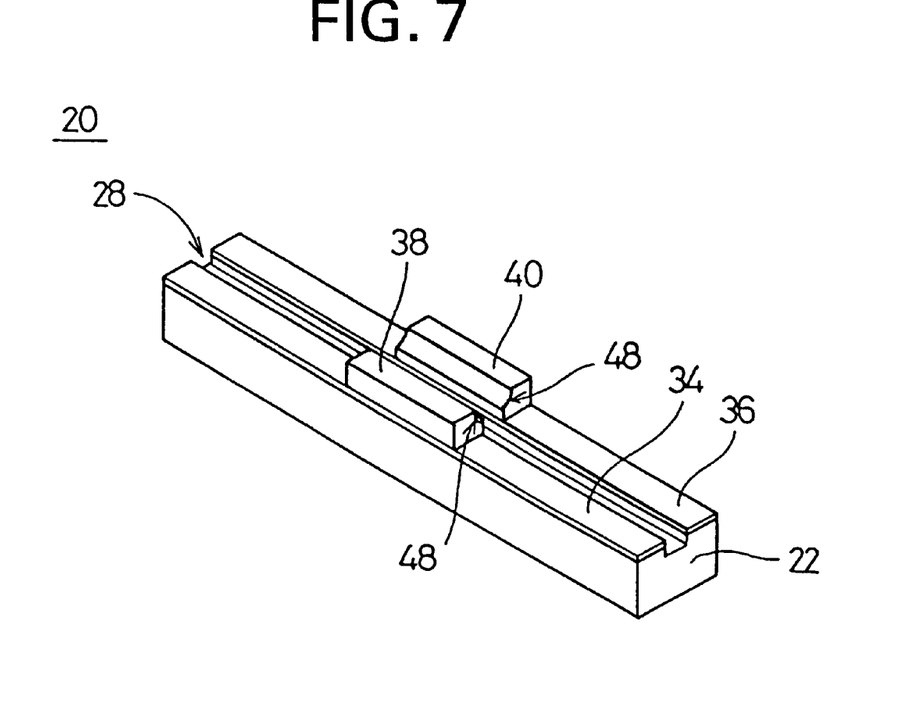
FIG. 7 is a perspective view of another piezoelectric resonator used for a piezoelectric component according to preferred embodiments of the present invention.
Figure 8:
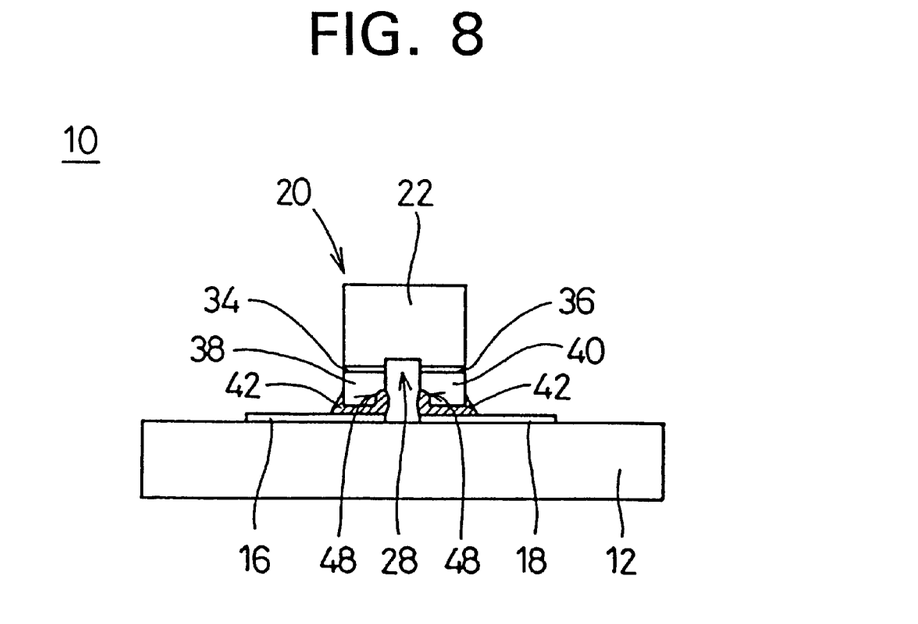
FIG. 8 is a side view of a condition in which the piezoelectric resonator shown in FIG. 7 is mounted on a substrate.

FIG. 7 is a side view of another piezoelectric resonator 20 for use in a piezoelectric component according to another preferred embodiment of the present invention. Slopes 48 are preferably formed near pattern electrodes 16 and 18 on opposing surfaces of support members 38 and 40 in this piezoelectric resonator 20. Therefore, as shown in FIG. 8, the bonding areas between the support members 38 and 40 and the pattern electrodes 16 and 18 of a substrate 12 become smaller than those between the support members 38 and 40 and external electrodes 34 and 36 of the piezoelectric resonator 20. In addition, the distance between the support members 38 and 40 is larger near the pattern electrodes 16 and 18 than near the external electrodes 34 and 36.

In such a piezoelectric component 10, when electrically conductive adhesive 42 flows between the support members 38 and 40, it moves along the inner surfaces of the support members 38 and 40 to fill the slopes 48. The amount of the electrically conductive adhesive 42 flowing between the support members 38 and 40 becomes small and a short circuit between the support members 38 and 40 is prevented. In addition, since the slopes 48 of the support members 38 and 40 are filled with the electrically conductive adhesive 42, the contact area between the support members 38 and 40 and the electrically conductive adhesive 42 becomes large, increasing the bonding strength between the support members 38, 40 and the pattern electrodes 16, 18.

Figure 9:
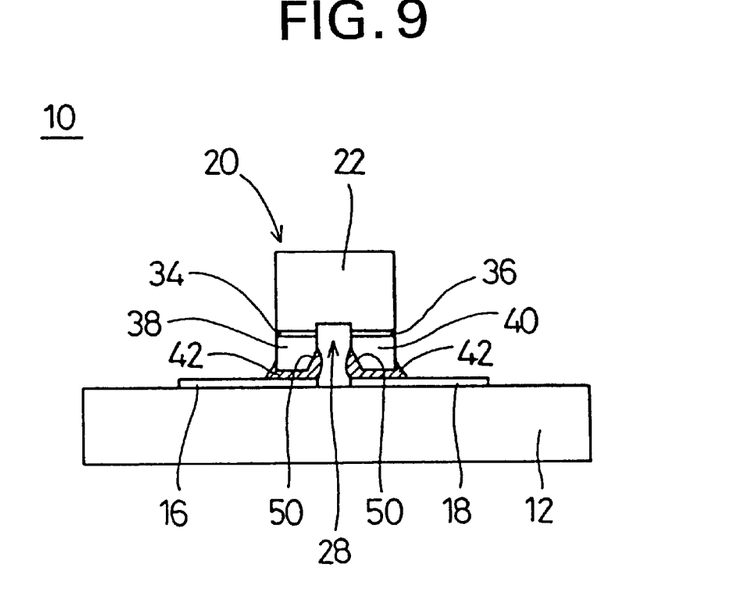
FIG. 9 is a side view of a modification of the piezoelectric component shown in FIG. 8.
Figure 10:
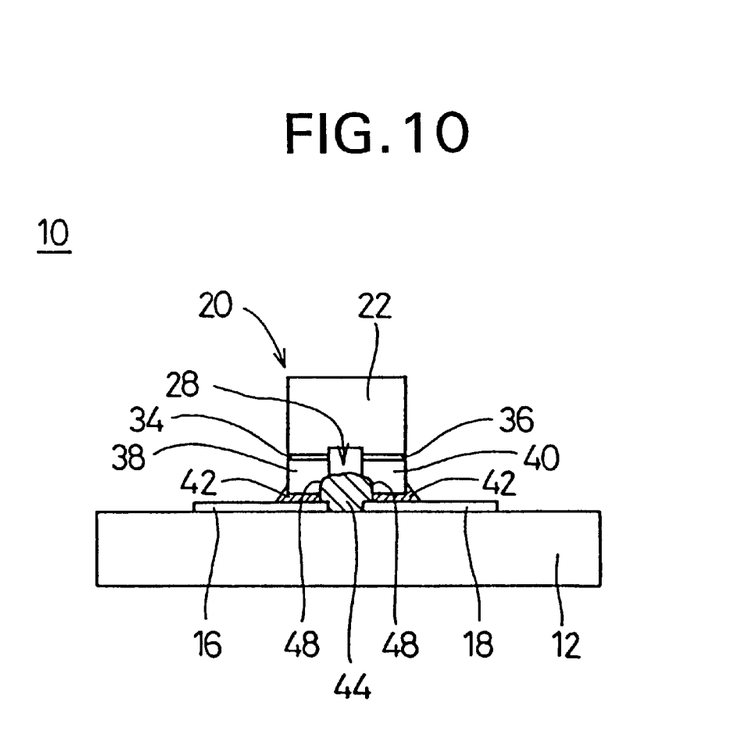
FIG. 10 is a side view of a modification of the piezoelectric component shown in FIG. 6.

To obtain such an advantage, instead of the slopes 48 provided at the support members 38 and 40, slanted portions 50 may be provided at the support members 38 and 40 as shown in FIG. 9. Even in such a case, electrically conductive adhesive 42 moves along the slanted portions 50, and the amount of the electrically conductive adhesive 42 flowing between the support members 38 and 40 becomes small. In addition, since the slanted portions 50 of the support members 38 and 40 are bonded to the pattern electrodes 16 and 18, a high bonding strength is obtained. When a piezoelectric resonator 20 provided with the slopes 48 or the slanted portions 50 at the support members 38 and 40 is used, insulating adhesive 44 may be placed between the support members 38 and 40 as shown in FIG. 10.

Figure 11:
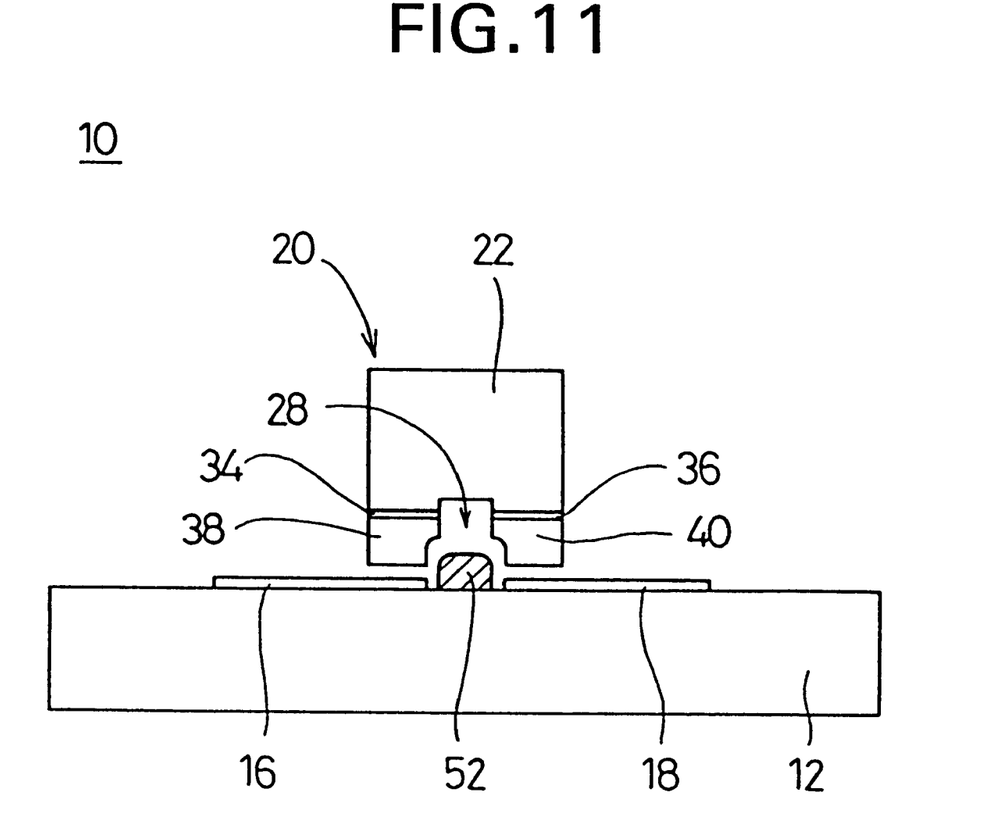
FIG. 11 is a side view of still another piezoelectric component according to preferred embodiments of the present invention.

FIG. 11 is a side view of still another piezoelectric component according to a preferred embodiment of the present invention. In this piezoelectric component 10, a protrusion 52 made from an insulating material is disposed on a substrate 12 between pattern electrodes 16 and 18. Even if electrically conductive adhesive (not shown) flows between support members 38 and 40 when a piezoelectric resonator 20 is mounted, the adhesive is blocked by the protrusion 52. Therefore, a short circuit between the support members 38 and 40 is prevented by the electrically conductive adhesive 42. Consequently, a larger amount of the electrically conductive adhesive 42 can be used and the bonding strength between the support members 38 and 40 and the pattern electrodes 16 and 18 is greatly increased. The protrusion 52 can be applied to a case in which support members 38 and 40 which are not provided with slopes 48 or slanted portions 50 is used, and to a case in which the support members 38 and 40 are not used.

Figure 12:
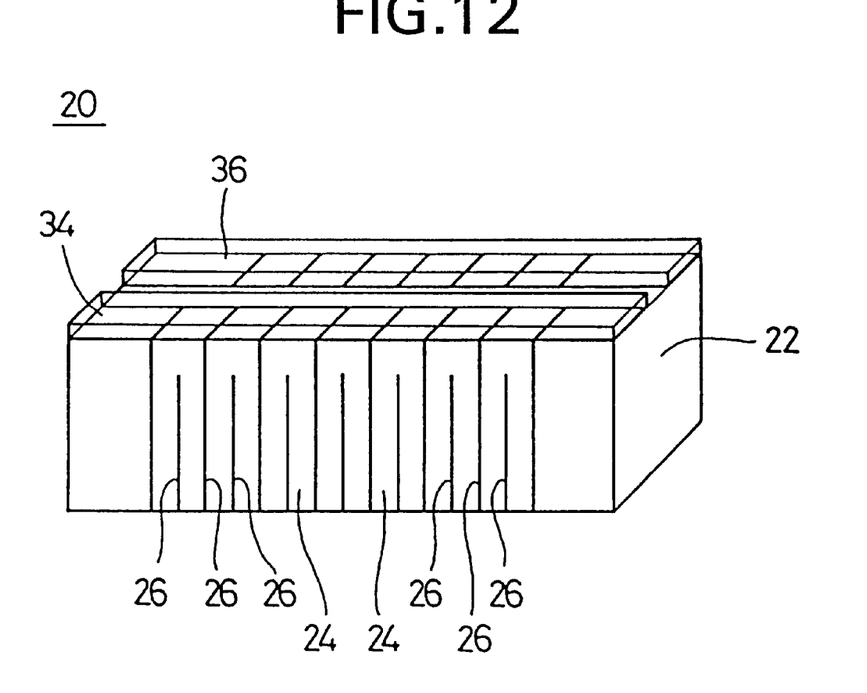
FIG. 12 is a view of yet another piezoelectric resonator used for a piezoelectric component according to preferred embodiments of the present invention.
Figure 13A:
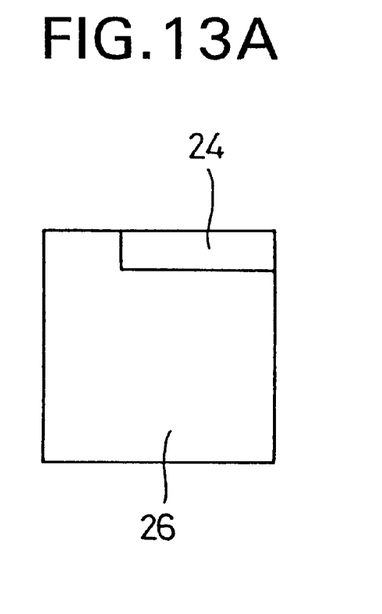
FIG. 13 is a plan view showing the relationship between electrodes and piezoelectric layers used for the piezoelectric resonator shown in FIG. 12.
Figure 13B:
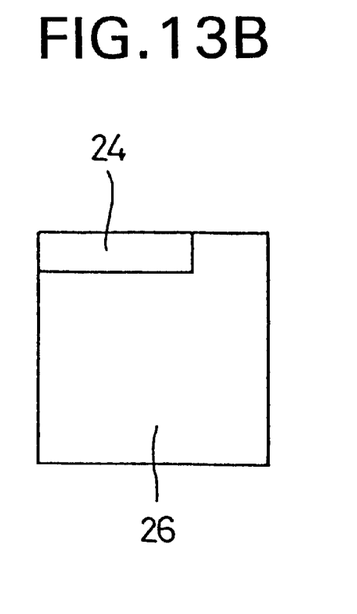

A piezoelectric resonator 20 having a structure shown in FIG. 12 can be used for such a piezoelectric component 10. Inner electrodes 26 of the piezoelectric resonator 20 are formed to have a substantially L-shaped configuration as shown in FIG. 13 such that only sections which are connected to external electrodes 34 and 36 are exposed at one side surface of a base member 22 and the other sections are not exposed. This piezoelectric resonator 20 differs from the piezoelectric resonator 20 shown in FIG. 1 in that insulating films 30 and 32 are not required.

Figure 14:
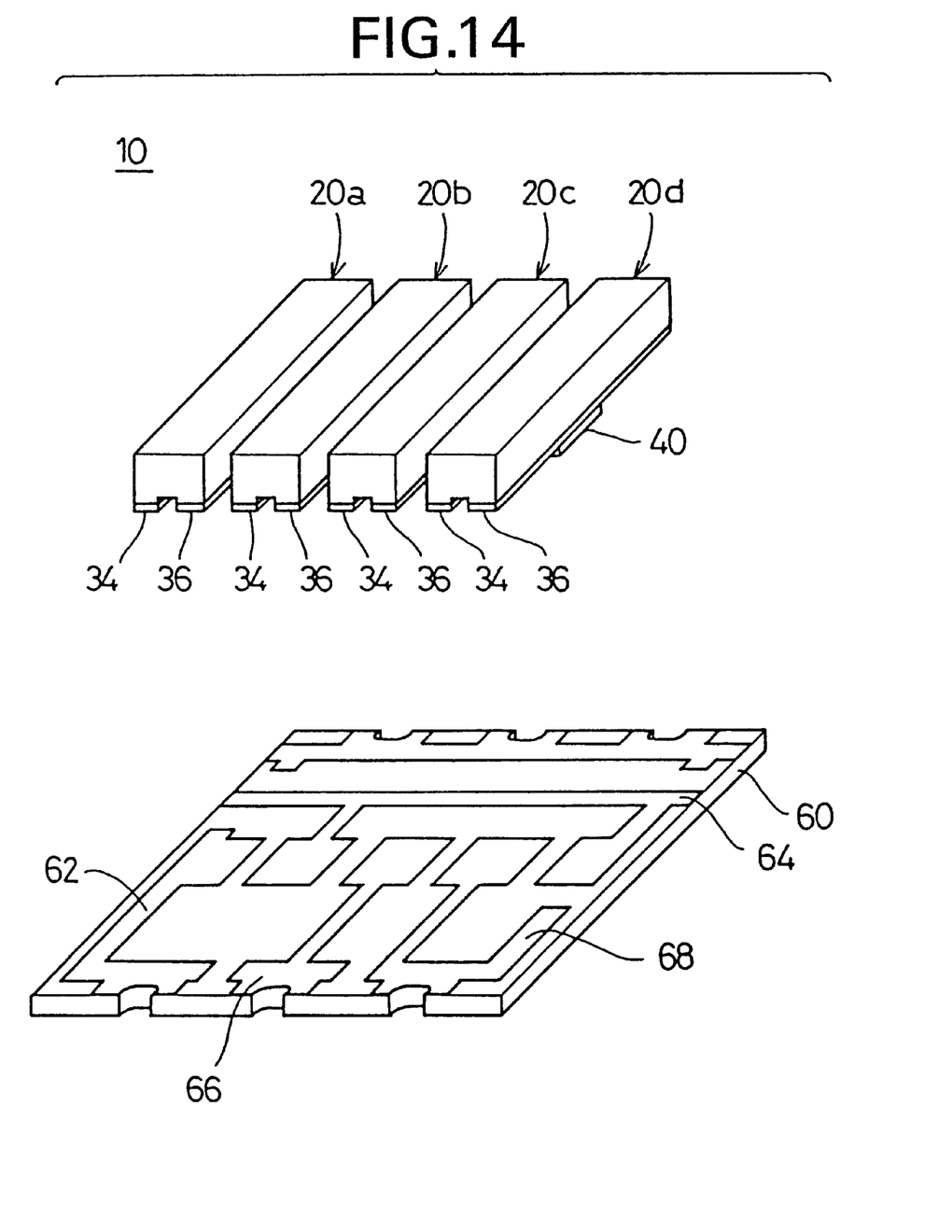
FIG. 14 is an exploded perspective view of a ladder filter using a plurality of piezoelectric resonators, serving as an electronic component of preferred embodiments of the present invention.

A plurality of piezoelectric resonators 20 may be used in a piezoelectric component 10. FIG. 14 is an exploded perspective view of a piezoelectric component which is used as a ladder filter having a ladder circuit. Four pattern electrodes 62, 64, 66, and 68 are disposed on a substrate 60 in the piezoelectric component 10. Five lands are provided in line at an interval on these pattern electrodes 62 to 68. A first land from one end of the substrate 60 is provided on the pattern electrode 62, a second land and a fifth land are provided on the pattern electrode 64, a third land is provided on the pattern electrode 66, and a fourth land is provided on the pattern electrode 68.

Support members 38 and 40 provided on external electrodes 34 and 36 of piezoelectric resonators 20a, 20b, 20c, and 20d are bonded to these lands via electrically conductive adhesive 42. In this case, the piezoelectric resonators 20a to 20d are mounted and arranged to obtain a ladder circuit shown in FIG. 15. Then, a cap (not shown) is placed on the substrate 60.

Figure 15:
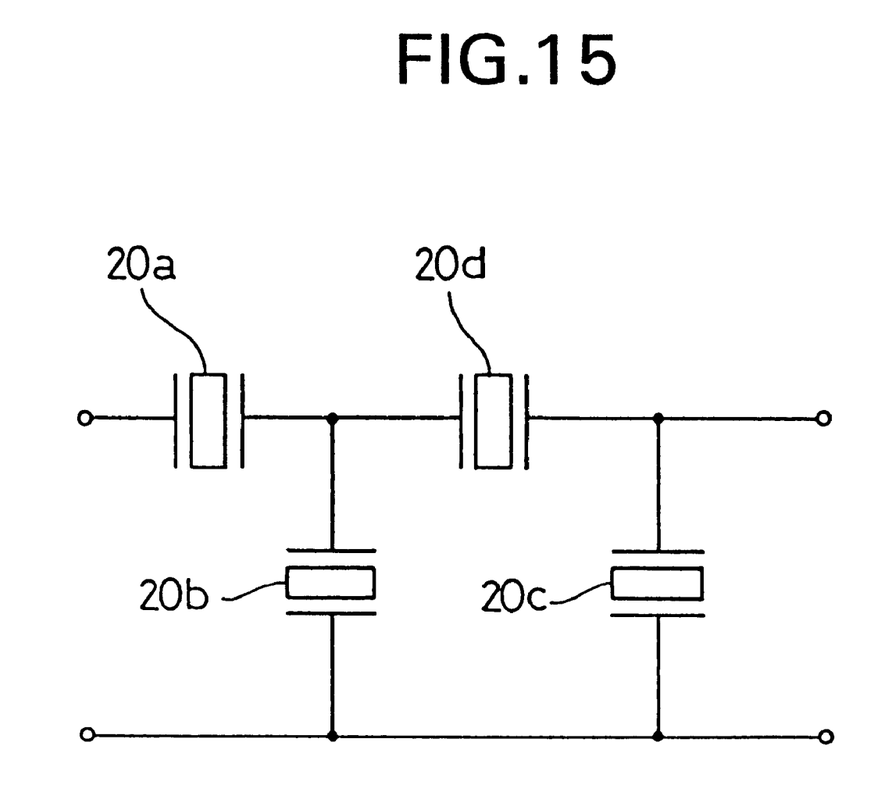
FIG. 15 is an equivalent circuit diagram of the ladder filter shown in FIG. 14.

This piezoelectric component 10 is used as a ladder filter having the ladder circuit shown in FIG. 15. Two piezoelectric resonators 20a and 20d serve as series resonators, and the other two piezoelectric resonators 20b and 20c serve as parallel resonators. In such a ladder filter, the parallel piezoelectric resonators 20b and 20c are designed to have larger capacitances than the series piezoelectric resonators 20a and 20d.

Also in the piezoelectric component 10 using the plurality of piezoelectric resonators 20a to 20d, when the support members 38 and 40 have the structure shown in FIG. 6, FIG. 8, FIG. 9, FIG. 10, or FIG. 11, a short circuit between the support members 38 and 40 caused by the electrically conductive adhesive 42 is prevented. In addition, since a high bonding strength is obtained, the piezoelectric component has a high reliability.

While the invention has been particularly shown and described with reference to preferred embodiments thereof, it will be understood by those skilled in the art that the forgoing and other changes in form and details may be made therein without departing from the spirit of the invention.

What is claimed is:

1. An electronic component, comprising:

a substrate having pattern electrodes disposed thereon;

a piezoelectric resonator disposed on said substrate and including a base member and at least two external electrodes provided on at least one side surface of the base member;

at least two electrically conductive bonding members between the pattern electrodes and the at least two external electrodes and arranged to support said piezoelectric resonator on said substrate, the at least two electrically conductive bonding members having inner surfaces disposed opposite to each other so as to face each other; and an insulating bonding member disposed only between said inner surfaces of said at least two electrically conductive bonding members.

2. An electronic component according to claim 1, wherein said insulating bonding member is an insulating protrusion which is disposed on said substrate between said at least two electrically conductive bonding members.

3. An electronic component according to claim 1, wherein said piezoelectric resonator is adapted to vibrate in a longitudinal vibration mode.

4. An electronic component according to claim 1, further comprising electrically conductive support members disposed on the at least two external electrodes of said piezoelectric resonator, wherein the pattern electrodes of the substrate are connected to the two external electrodes through said support members.

5. An electronic component according to claim 1, wherein the base member comprises a laminated unit including piezoelectric layers and inner electrodes connected to the external electrodes, the piezoelectric layers being polarized in the longitudinal direction of the base member, and said piezoelectric resonator is vibrated in a longitudinal vibration in a basic mode when an electric field is applied thereto.

6. An electronic component according to claim 1, wherein the base member includes a groove formed in a surface thereof, the groove being arranged to separate each of the at least two external electrodes and the at least two electrically conductive bonding members.

7. An electronic component according to claim 1, wherein each of the at least two electrically conductive bonding members has a width that is substantially equal to a width of a respective one of the at least two external electrodes.

8. An electronic component according to claim 1, wherein a polarization direction, a direction of application of electric field and a direction vibration of the piezoelectric resonator are the same.

9. An electronic component according to claim 1, wherein the at least two electrically conductive bonding members are located at an approximate center portion of the piezoelectric resonator and support the piezoelectric resonator at a location of a vibration node thereof.

10. An electronic component according to claim 1, wherein the insulating bonding member is disposed in contact with side surfaces of the at least two electrically conductive bonding members.

11. An electronic component according to claim 1, wherein each of said support members are shaped such that an area of a surface thereof located at a side of the pattern electrodes is smaller than that of a surface thereof at a side of the external electrodes, and a distance between said at least two support members is larger at the side of the pattern electrodes than a distance between said at least two support members at the side of the external electrodes.

12. An electronic component according to claim 1, wherein each of said at least support members includes a curved slope portion.

13. An electronic component according to claim 1, wherein each of said at least support members includes a slanted portion.

14. An electronic component, comprising:

a substrate having pattern electrodes disposed thereon;

a piezoelectric resonator disposed on said substrate and including a base member and at least two external electrodes provided on at least one side surface of the base member; and at least two electrically conductive support members disposed on the two external electrodes so as to connect the pattern electrodes and the two external electrodes and arranged to support said piezoelectric resonator on said substrate; wherein each of said support members are shaped such that an area of a surface thereof at a side of the pattern electrodes is smaller than that of a surface at a side of the external electrodes, and a distance between said at least two support members is larger at the side of the pattern electrodes than at the side of the external electrodes.

15. An electronic component according to claim 14, wherein said support members and the pattern electrodes are connected via said electrically conductive support members.

16. An electronic component according to claim 14, further comprising an insulating bonding member disposed between said at least two electrically conductive bonding members.

17. An electronic component according to claim 16, wherein said insulating bonding member is an insulating protrusion which is disposed on said substrate between said at least two electrically conductive bonding members.

18. An electronic component according to claim 16, wherein the insulating bonding member is disposed in contact with side surfaces of the at least two electrically conductive bonding members.

19. An electronic component according to claim 14, wherein each of said at least two support members includes a curved slope portion.

20. An electronic component according to claim 14, wherein each of said at least two support members includes a slanted portion.

* * * * *